United States Patent [19]
Krieger

[11] Patent Number: 5,668,383
[45] Date of Patent: Sep. 16, 1997

[54] SEMICONDUCTOR DEVICE FOR BIDIRECTIONAL NON-CONDUCTED OPTICAL DATA TRANSMISSION

[75] Inventor: Ralph-Jochen Krieger, Mosbach, Germany

[73] Assignee: Temic Telefunken microelectronic GmbH, Heilbronn, Germany

[21] Appl. No.: 554,239

[22] Filed: Nov. 8, 1995

[30] Foreign Application Priority Data

Nov. 10, 1994 [DE] Germany .................. 44 40 088.8

[51] Int. Cl.⁶ .................. H01L 27/18; H01L 23/495
[52] U.S. Cl. .................. 257/80; 257/81; 257/666
[58] Field of Search .................. 257/81, 82, 83, 257/682, 666, 99, 100, 88, 84

[56] References Cited

FOREIGN PATENT DOCUMENTS

| | | |
|---|---|---|
| 0226868 | 7/1987 | European Pat. Off. . |
| 0588014 | 3/1994 | European Pat. Off. . |
| 3037307 | 4/1981 | Germany . |
| 3046140 | 7/1982 | Germany . |
| 4031051 | 5/1991 | Germany . |
| 3941679 | 6/1991 | Germany . |
| 4004053 | 8/1991 | Germany . |
| 4024575 | 2/1992 | Germany . |
| 4206437 | 9/1993 | Germany . |
| 4212948 | 10/1993 | Germany . |
| 2114368 | 8/1983 | United Kingdom . |

OTHER PUBLICATIONS

Claus Reuber: "Optotuner fuer den Daten-Highway". In: Elektronik 15/1994, pp. 46-50.
Hans-Georg Unter: "Optische Nachrichtentechik". In: vol. 2, 1992, pp. 561-567.

Primary Examiner—Mahshid D. Saadat
Assistant Examiner—Jhihan B. Clark
Attorney, Agent, or Firm—Spencer & Frank

[57] ABSTRACT

A semiconductor device for bidirectional non-conducted optical data transmission by means of electromagnetic waves from within the infrared waveband will be described. The semiconductor device will comprise a transmission chip emitting radiation within the IR waveband, a receiver chip responding to radiation within the IR waveband by emitting a photo-electric current, as well as an integrated circuit for amplifying the photo-electric current of the receiver chip. These three semiconductor chips will be mounted onto a lead frame configuration comprising at least three leads. On the flat side face of the lead frame configuration, the integrated circuit will be located on a first level or plane which is parallel to the longitudinal direction of the lead frame configuration. On the end faces of the leads, the transmission chip and the receiver chip will be located on a second level or plane which runs in a perpendicular direction to the first level or plane. By mounting the components on two levels or planes perpendicular to each other, an assembly results which allows its casing dimensions to be designed to be very compact indeed. The optically relevant components will be located at the end face of the leads whereas the integrated circuit will be located in an optically protected side face position. Due to its compact build, the semiconductor device will be particularly suitable for use on a PCMCIA board to provide for IR communications applications in personal computers.

5 Claims, 1 Drawing Sheet

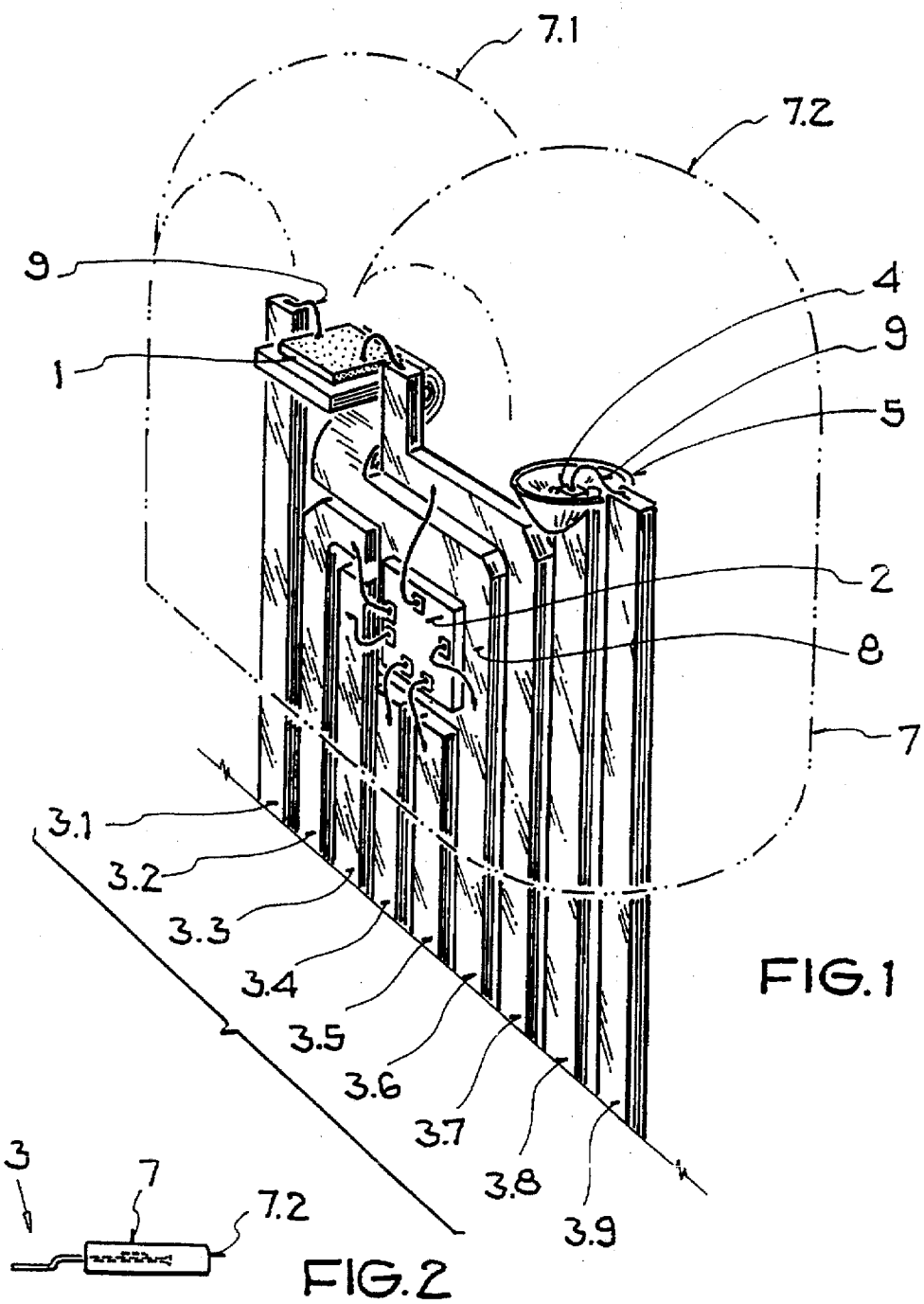
FIG.1
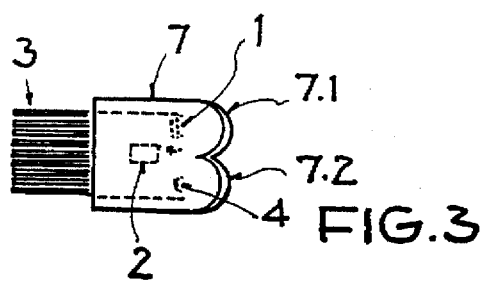
FIG.2
FIG.3

SEMICONDUCTOR DEVICE FOR BIDIRECTIONAL NON-CONDUCTED OPTICAL DATA TRANSMISSION

BACKGROUND OF THE INVENTION

Bidirectional non-conducted serial data transmission, by means of electromagnetic waves from the infrared wave band, continues to increase in significance. Thus, for instance, in applications such as data transmission between a personal computer and its peripheral components.

For remote control applications, devices are available on the market—and known from DE 42 12 948', which also comprise, in addition to an infrared receiver, an amplifier IC amplifying the photo-electric current of the receiver, as well as further passive components such as capacities and resistors. This known device therefore comprises all analog components required for reception and evaluation of the IR remote control signals. It is built up in lead frame technology, that is all chips and passive components will be mounted in a single level or plane onto a lead frame.

The specialist now faces the task to define a semiconductor device for optical data transmission, which device comprises in one common architecture all necessary functions such as transmission, reception, and amplification, features small dimensions, and where the mutual interference of the chips involved will be minimized.

SUMMARY OF THE INVENTION

This invention provides for a semiconductor device comprising a receiver chip (1) responding to radiation in the IR waveband by emitting a photo-electric current $I_{PH}$, an integrated circuit (2) for amplifying the photo-electric current $I_{PH}$ of the receiver chip (1), and a lead frame configuration (3) consisting of at least three leads onto which receiver chip (1) and integrated circuit (2) mounted, and wherein the semiconductor device further comprises a transmission chip (4), emitting radiation within the IR waveband; the integrated circuit (2) is located on a first level or plane parallel to the longitudinal direction of the lead frame configuration (3); and the transmission chip (4) and receiver chip (1) each are located on a second level or plane perpendicular to the first level or plane at an end of the lead frame configuration (3).

The advantageous further design of this semiconductor device will be implemented according to the features of the dependent claims.

According to this invention, the semiconductor device will consist of a transmission chip emitting radiation within the IR waveband, a receiver chip responding to radiation within the IR waveband by emitting a photo-electric current, as well as an integrated circuit for amplifying the photo-electric current of the receiver chip. These three semiconductor chips will be mounted onto a lead frame configuration comprising at least three leads. On the flat side face of the lead frame configuration, the integrated circuit will be located on a first level or plane which is parallel to the longitudinal direction of the lead frame configuration. On the end faces of the leads, the transmission chip and the receiver chip will be located on a second level or plane which runs in a vertical direction to the first level. By combining vertical lead frame and horizontal lead frame technologies, as well as by locating the components on two levels or plane perpendicular to each other, an assembly results which allows its casing dimensions to be designed to be very compact indeed. The optically relevant components will be located at the end faces of the leads whereas the integrated circuit will be located in an optically protected side face position. This prevents the integrated circuit from coming into direct contact with radiation.

A first lead features a reflector moulded onto the end face. This reflector will contain the transmission chip. A second lead is angled at one end. On the angled part of this lead frame, the receiver chip will be mounted on the surface pointing away from the lead.

The top end of the lead frame configuration is provided with an encapsulated body. This encapsulated body will be permeable for radiation within the IR waveband and encloses the transmission chip, receiver chip, and integrated circuit. The encapsulated body features two spherically molded surface shapes located such that separate optical focussing devices are created, respectively, for the receiver chip and the transmission chip. The casing of this assembly is not dissimilar to a standard light emitting diode. The differences exist in the number of lead connections, and in the shaping of the encapsulated body with its two optical lenses.

BRIEF DESCRIPTION OF THE DRAWINGS

FIG. 1 illustrates the semiconductor assembly in perspective view,

FIG. 2 illustrates the semiconductor assembly in side view,

FIG. 3 illustrates the semiconductor assembly in top view.

DESCRIPTION OF THE PREFERRED EMBODIMENTS

In the following, an example of an embodiment of this semiconductor device will be explained by means of these figures. The semiconductor device according to FIGS. 1 to 3 will be set up on a lead frame configuration 3 comprising nine leads 3.1 to 3.9. This lead frame configuration will usually be manufactured as a metal stamped part from copper sheeting with a thickness of approximately 0.3 mm. Until the semiconductor device has been encapsulated at the top end of the leads, using a suitable encapsulating material, leads 3.1 to 3.9 will be linked to each other at their bottom ends by cross-links not shown in the figures.

A first lead 3.6 will be designed such that a fitting or pad area 8 is located on its top part for mounting the integrated circuit 2. This integrated circuit 2 is provided in chip format and represents an amplifier for the photo-electric current supplied by the receiver chip.

Along its extension, the first lead 3.6 will be angled such that a second fitting or pad area 6 is provided. In this area, receiver chip 1 will be located such that its principal plane extends in a direction which is perpendicular to the mounting level or plane of the integrated circuit 2. The surface normal of the receiving plane for the receiver chip 1 points away from the lead frame configuration. It will also be possible, of course, to locate the receiver chip on its own lead. Even in this case, the end of the relevant lead will be angled to enable mounting at a right angle to the amplifier IC.

In addition, one lead 3.8 will also be fitted with a reflector 5 at its top end; at the centre of this reflector, transmission chip 4 will be mounted on the same level or plane as receiver chip 1. This reflector 5 forms an integral part of lead 3.8 and represents its top end.

The other leads are used for electrically connecting the various chips and integrated circuits. Their number will be dependent on the requirements that the semiconductor device must meet, and on the functions that this semiconductor device comprises. Using bonding wires 9, the connections between chips and leads will be made. Alternatively, the connection between the chips and the leads on which they are mounted can also be made by a soldered connection or some conductive adhesive.

Thus, the optically relevant chips 1 and 4 will be mounted using vertical lead frame technology, whilst the amplifier IC 2 will be fitted at a right angle by means of horizontal lead frame technology. The integrated circuit 2 will be located in an optically protected position and fitted with an optimum number of connection options, adapted to the number of electrical connections actually required.

The semiconductor device is enclosed by an encapsulating body, which can be manufactured by the normal techniques used for opto-electronic components. This encapsulating body 7 illustrated in FIGS. 1 to 3 can be manufactured, and taken out of the mould, without any problems using standard encapsulation techniques. The optical systems 7.1, 7.2 integrated into the encapsulation body can be optimized separately for the transmission and receiver chips, respectively. The two lens-shaped surfaces 7.1, 7.2 also ensure that the transmission chip does not directly radiate onto the receiver chip.

As the optically relevant chips will be located by means of vertical lead frame technology at the top end of the lead configuration, the resulting dimensions of the complete device will be quite small. And it is because of the compact dimensions that this device will also be suitable to mount onto a PCMCIA board for optical data transmission.

What is claimed is:

1. A semiconductor device comprising;

a receiver chip responding to radiation in the IR waveband by emitting a photo-electric current $I_{PH}$, an integrated circuit for amplifying the photoelectric current $I_{PH}$ of the receiver chip, a transmission chip emitting radiation within the IR wavebound, and a lead frame configuration consisting of at least three leads onto which the receiver chip, the integrated circuit, and the transmission chip are mounted; and wherein the integrated circuit is located in a first plane parallel to the longitudinal direction of the lead frame configuration, and the transmission chip, as well as the receiver chip, each are located in a second plane which is perpendicular to the first plane, at an end of the lead frame configuration.

2. A semiconductor device according to claim 1 wherein a first lead has a reflector moulded onto one end, surface within which reflector the transmission chip is mounted.

3. A semiconductor device according to claim 2 wherein a second lead has an angled part at one end, and the receiver chip is mounted onto this angled part.

4. A semiconductor device according to claim 3 wherein the lead frame configuration is partially—and the integrated circuit, receiver chip, and transmission chip completely—enclosed by an encapsulating body permeable for radiation within the IR waveband.

5. A semiconductor device according to claim 4 wherein the encapsulating body has a respective lens-shaped surface for each of the transmission and receiver chips, with each of these lens-shaped surfaces being an optically refracting element.

* * * * *